US006982561B2

(12) United States Patent
Scott

(10) Patent No.: US 6,982,561 B2
(45) Date of Patent: Jan. 3, 2006

(54) SCATTERING PARAMETER TRAVELLING-WAVE MAGNITUDE CALIBRATION SYSTEM AND METHOD

(75) Inventor: Jonathan B. Scott, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/857,419

(22) Filed: May 27, 2004

(65) Prior Publication Data

US 2005/0264301 A1    Dec. 1, 2005

(51) Int. Cl.
GO1R 27/04    (2006.01)
GO1R 35/00    (2006.01)
(52) U.S. Cl. .................... 324/638; 324/601; 702/107
(58) Field of Classification Search ............... 324/638, 324/637, 629, 605, 600–602, 612, 646, 76.12, 324/76.13, 639–644; 702/57, 65, 73, 85, 702/90, 108, 117, 118, 107
See application file for complete search history.

(56) References Cited

U.S. PATENT DOCUMENTS

| | | | |
|---|---|---|---|
| 5,003,253 A | | 3/1991 | Majidi-Ahy et al. |
| 5,552,714 A | * | 9/1996 | Adamian et al. ........... 324/601 |
| 6,008,656 A | | 12/1999 | Heuermann |
| 6,188,968 B1 | | 2/2001 | Blackham |
| 6,650,123 B2 | * | 11/2003 | Martens ...................... 324/601 |
| 6,697,749 B2 | * | 2/2004 | Kamitani ..................... 702/107 |
| 6,836,743 B1 | * | 12/2004 | Blackham et al. ........... 702/107 |
| 2004/0051538 A1 | * | 3/2004 | Adamian ...................... 324/601 |

OTHER PUBLICATIONS

Agilent De-Embedding and Embedding S-Parameter Networks Using a Vector Network Analyzer; Application Note 1364-1; Agilent Technologies; pp 1-23.
PH50 System User Manual; 45MHz-50GHz, 50Ω, Power and Harmonic Measurement System: Release 5, Dec. 6, 2000.

* cited by examiner

Primary Examiner—Vincent Q. Nguyen
Assistant Examiner—Hoai-An D. Nguyen

(57) ABSTRACT

A calibration system and method determines magnitudes of traveling-waves at a non-coaxial plane of a scattering (S) parameter measurement device that includes an adapter link between the non-coaxial plane and a coaxial plane. A calibration is conducted at an interface between the adapter link and the coaxial plane to derive coaxial error terms for the S-parameter measurement device. In addition, a power meter measurement is conducted at the coaxial plane to obtain power wave measurements using the coaxial error terms. A calibration is also conducted at an interface between the adapter link and the non-coaxial plane to derive non-coaxial error terms for the S-parameter measurement device. The power wave measurements, coaxial error terms and non-coaxial error terms are used to calculate the magnitude of one of the traveling-waves at the non-coaxial plane.

26 Claims, 3 Drawing Sheets

SCATTERING PARAMETER TRAVELLING-WAVE MAGNITUDE CALIBRATION SYSTEM AND METHOD

BACKGROUND OF THE INVENTION

In the RF and microwave frequency ranges (1 MHz to over 40 GHz), devices are frequently characterized by their scattering (S) parameters. S-parameters provide information on device performance and can be easily measured by any commercially available network analyzer. Network analyzers can be grouped into two categories: scalar network analyzers (SNAs) and vector network analyzers (VNAs). SNAs measure the amplitudes of the S-parameters, while VNAs measure both the amplitudes and phases of the S-parameters.

In operation, when the ports of a device under test (DUT) are connected to the ports of a network analyzer, the network analyzer applies a signal (travelling-waves $a_1$ and $a_2$) to each device port in succession and measures the amplitude and the phase (when using a VNA) of the reflected ($b_1$ and $b_2$) and transmitted waves ($a_1$ and $a_2$) to determine the S-parameters (ratios of $b_1,b_2$ to $a_1,a_2$) of the DUT. However, with virtually any network analyzer, there are inevitable hardware imperfections that can produce significant errors in the S-parameter measurements of the DUT. The process of characterizing the imperfections in the network analyzer is known as calibration.

The result of a network analyzer calibration is a mathematical error model including a number of unknown error terms that describe all of the main error contributions of the network analyzer. In a typical calibration, certain well-known devices, called standards, are connected to the network analyzer, and the resulting S-parameter measurements are used to mathematically solve for the error terms of the error model. After calibration, the error terms can be removed from the measurement of any DUT to correct for imperfections in the network analyzer. Thus, the actual S-parameters of the DUT $S_{11}$ (forward reflection coefficient), $S_{22}$ (reverse reflection coefficient), $S_{12}$ (forward transmission coefficient) and $S_{21}$ (reverse transmission coefficient) are equivalent to the S-parameters measured at the network analyzer with the error terms removed.

Network analyzers are normally designed to measure the S-parameters of linear devices using coaxial interfaces. When the DUT is linear, the values of the S-parameters are independent of the power level at which the measurements are made. However, if the DUT is non-linear, the S-parameter values may vary with power. As a result, correct interpretation of the S-parameter values of non-linear devices may require knowledge of the absolute magnitude (signal level) of the input travelling-wave at the device under test. The process of determining the absolute magnitude of the input travelling-wave is known as power wave calibration, a power calibration or a receiver calibration, hereinafter referred to as a power wave calibration. A power wave calibration resembles a normal calibration on a network analyzer, except that the absolute magnitudes of the travelling-waves are measured as well as the usual S-parameters to determine the error terms of the error model. Typically, a power meter is connected to one of the coaxial ports of the network analyzer to measure the input reflection coefficient of the power meter at the network analyzer and the power of the input travelling-wave at the power meter. Both the input reflection coefficient of the power meter and the power meter reading are used to mathematically solve for the absolute magnitude of the input travelling-wave.

For example, a DUT that contains semiconductor devices is typically a non-linear DUT for which a power wave calibration needs to be performed. If the DUT is located on a wafer, planar waveguide interfaces are typically coupled to the traditional coaxial interfaces on the network analyzer to measure the S-parameters of the DUT. To accurately correct the S-parameters of the DUT, the error model must include not only the coaxial interface, but also the planar waveguide interface. Thus, the network analyzer calibration is typically performed at the planar waveguide plane using waveguide standards similar to traditional coaxial standards. However, power meters typically have coaxial interfaces that cannot be directly connected to planar waveguide interfaces, which prevents a power wave calibration from being performed.

One solution is to attach a coaxial to waveguide adapter to the power meter. However, the addition of an adapter undesirably introduces new errors into the power calibration measurement system. Another solution is to modify the hardware of the network analyzer to position the $a_2$ and $b_2$ directional couplers between the waveguide calibration plane and the coaxial power calibration port. However, requiring the use of special equipment in the form of a modified network analyzer to perform a power wave calibration increases the cost of measuring S-parameters, both as a result of the actual cost of the modified network analyzer and the cost to train technicians to use the modified network analyzer.

Therefore, what is needed is a calibration system and method that determines magnitudes of travelling-waves at a non-coaxial plane of a network analyzer without requiring power meter adapters or modified network analyzer hardware.

SUMMARY OF THE INVENTION

Embodiments of the present invention provide a calibration system and method that determines magnitudes of travelling-waves at a non-coaxial plane of a scattering (S) parameter measurement device that includes an adapter link between the non-coaxial plane and a coaxial plane. A calibration is conducted at an interface between the adapter link and the coaxial plane to derive coaxial error terms for the S-parameter measurement device. In addition, a power meter measurement is conducted at the coaxial plane to obtain power wave measurements using the coaxial error terms. A calibration is also conducted at an interface between the adapter link and the non-coaxial plane to derive non-coaxial error terms for the S-parameter measurement device. The power wave measurements, coaxial error terms and non-coaxial error terms are used to calculate the magnitude of one of the travelling-waves at the non-coaxial plane.

In one embodiment, a calibration for the adapter link is extracted from the non-coaxial error terms and coaxial error terms using an adapter removal algorithm. From the adapter link calibration, the S-parameters of the adapter link are determined. The adapter link S-parameters, along with the power wave measurements, coaxial error terms and non-coaxial error terms are used to calculate the magnitude of one of the travelling-waves at the non-coaxial plane.

In another embodiment, the magnitude of an additional travelling-wave propagating across a zero-length thru at the coaxial plane towards the adapter link is determined using the coaxial error terms and the S-parameters of the adapter link. For example, in one implementation embodiment, the value of one of the two error coefficients making up a reflection tracking error term of the coaxial error terms is determined using the power wave calibration measurements. The magnitude of the additional travelling-wave is calculated using the error coefficient value and the value of a reflection coefficient S-parameter of the adapter link. In a further embodiment, the magnitude of the select travelling-wave is calculated using the magnitude of the additional travelling-wave, the S-parameters of the adapter link and a value of a reflection coefficient S-parameter at the non-coaxial plane calculated using the non-coaxial error terms.

In still a further embodiment, the select travelling-wave is a forward travelling-wave, and the magnitude of a reverse travelling-wave is determined by measuring respective values of travelling-waves at the coaxial plane with a thru standard at the non-coaxial plane and respective values of travelling-waves at the non-coaxial plane with a thru standard at the coaxial plane.

Advantageously, embodiments of the present invention enable the determination of magnitudes of travelling-waves at a non-coaxial plane of a network analyzer without requiring power meter adapters or modified network analyzer hardware. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS

Figure 1:
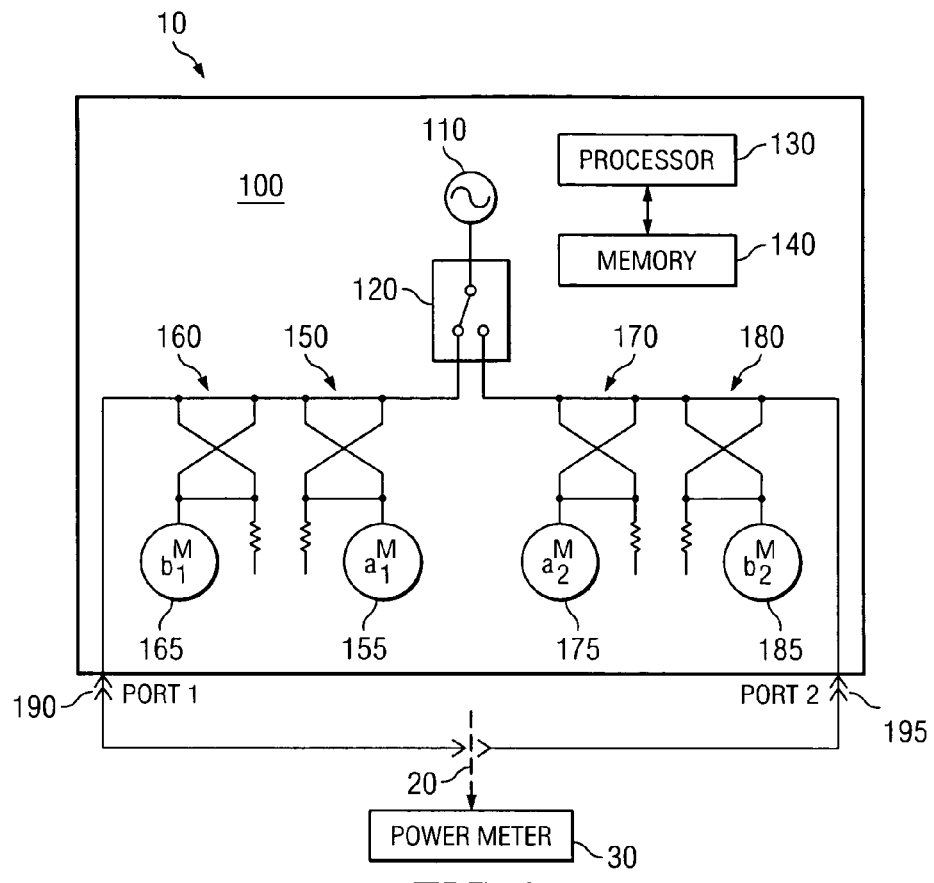
FIG. 1 is a block diagram of an exemplary S-parameter power wave calibration system.

FIG. 1 is a block diagram of an exemplary S-parameter power wave calibration system 10 for determining the absolute magnitudes of travelling-waves at a device under test (DUT). Power wave calibration system 10 includes a network analyzer 100 and a power meter 30 connected to network analyzer 100 at an insertion plane 20 of the DUT. Network analyzer 100 shown in FIG. 1 is a vector network analyzer.

Network analyzer 100 includes a processor 130 connected to a memory medium 140, which together control the operation of the network analyzer 100 and the power wave calibration system 10. Processor 130 can be a microprocessor, microcontroller, programmable logic device or any other processing device. In one embodiment, memory medium 140 includes software programmed to calibrate the network analyzer 100 and determine the magnitude of the travelling-wave that is executable by processor 130. In another embodiment, processor 130 is programmed to calibrate the network analyzer 100 and determine the magnitude of the travelling-wave and memory medium 140 stores calibration measurements and error terms used by processor 130. Memory medium 140 can be any type of computer-readable medium, whether permanent or transportable. For example, memory medium 140 can be a flash ROM, EEPROM, ROM, RAM, hard disk, compact disk, floppy disk, tape drive, optical disk or any other type of storage device.

In a further embodiment, at least a portion of memory medium 140 and/or processor 130 can be located external to network analyzer 100. For example, memory medium 140 and/or processor 130 can be included in a computing device, such as a personal computer or server. The computing device can be either connected to the network analyzer 100 to control the calibration and/or power wave calibration or receive up-loaded calibration measurements taken by the network analyzer 100 from a memory device (permanent or transportable) associated with the network analyzer 100.

Network analyzer 100 further includes a source generator 110, switch 120, couplers 150, 160, 170 and 180 and receivers 155, 165, 175 and 185. Receivers 155 and 165 are connected to a first coaxial port (Port 1) 190 and receivers 175 and 185 are connected to a second coaxial port (Port 2) 195. Source generator 110 generates a signal (travelling-wave) that is transmitted to switch 120. Switch 120 is set to transmit the signal to either Port 1 190 or Port 2 195. When switch 120 is set to transmit the signal to Port 1 190, receiver 155 measures the incident travelling-wave $a_1^M$, a receiver 165 measures the reflected travelling-wave $b_1^M$ from Port 1 190 and receiver 185 measures the transmitted travelling-wave (not specifically shown in FIG. 1) from Port 1 190 to Port 2 195. When switch 120 is set to transmit the signal to Port 2 195, receiver 175 measures the incident travelling-wave $a_2^M$, receiver 185 measures the reflected travelling-wave $b_2^M$ from Port 2 195 and receiver 165 measures the transmitted travelling-wave (not specifically shown in FIG. 1) from Port 2 195 to Port 1 190.

Power wave calibration system 10 is designed to perform a power wave calibration of network analyzer 100 to determine the absolute magnitude of each of the travelling-waves $a_1$, $b_1$, $a_2$ and $b_2$ at the DUT insertion plane 20. Initially, power wave calibration system 10 carries out a normal, full, two-port calibration of network analyzer 100 at the coaxial connectors at the DUT insertion plane 20 to calculate the error terms for the two-port error model of network analyzer 100 at the DUT insertion plane 20. Once the error terms have been computed, power meter 30 is attached to one of the ports 190 or 195 of network analyzer at the DUT insertion plane 20.

For example, power meter 30 can be connected to Port 1 190 of network analyzer 100. At a single, convenient power level, the raw signal values $a_1^M$ and $b_1^M$ are measured to determine the input reflection coefficient of the power meter $\Gamma_P$ while connected to Port 1 190. From the input reflection coefficient of the power meter and the value of the power meter at the time of the power measurement, the absolute magnitude of the input travelling-wave $a_1$ at the DUT insertion plane 20 can be calculated, as will be described in more detail below.

Figure 2:
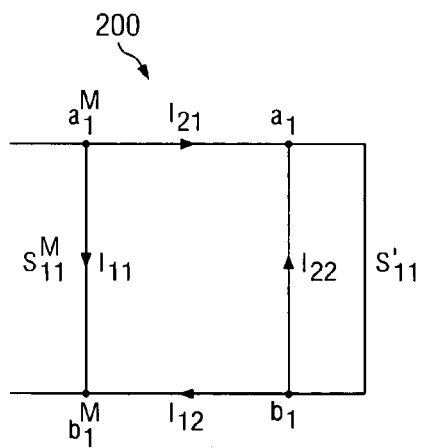
FIG. 2 is a flow diagram of the one-port forward error model for measuring the input reflection coefficient at port 1.

FIG. 2 depicts the signal flow diagram of the one-port forward error model 200 for measuring the input reflection coefficient $S'_{11}$ at Port 1. The forward error model 200 is composed of error coefficients $I_{11}$, $I_{12}$, $I_{21}$ and $I_{22}$. The familiar error terms $E_{d1}$, $E_{r1}$ and $E_{s1}$ calculated during the normal, full, two-port calibration of the network analyzer are related to the error coefficients $I_{11}$, $I_{12}$, $I_{21}$ and $I_{22}$ as follows: $E_{d1}=I_{11}$; $E_{s1}=I_{22}$; and $E_{r1}=I_{12}I_{21}$. $E_{d1}$ corresponds to the forward directivity error term, $E_{r1}$ corresponds to the forward reflection tracking error term and $E_{s1}$ corresponds to the forward source match error term.

As is understood in the art, the value of a node is the sum of all signals entering the node. Each signal is the value of the node from which it comes multiplied by the path error coefficient. Thus, it can be observed from FIG. 2 that the value of node $a_1$ can be represented by the following equation:

$$a_1 = \frac{a_1^M I_{21}}{1 - I_{22} S'_{11}} \tag{1}$$

and so:

$$|a_1| = \frac{|a_1^M||I_{21}|}{|1 - I_{22} S'_{11}|} \tag{2}$$

where all of the terms are known except $I_{21}$, and the term $S'_{11}$ is the one-port input reflection coefficient, to be distinguished from the reflection coefficient S-parameter $S_{11}$ that is derived from the complete two-port error model. Thus, $S'_{11}$ is derived from the three-term forward error model shown in FIG. 2 as follows:

$$S'_{11} = \frac{S_{11}^M - E_{d_1}}{E_{r_1} + E_{s_1}(S_{11}^M - E_{d_1})} = \frac{S_{11}^M - I_{11}}{I_{12}I_{21} + I_{22}(S_{11}^M - I_{11})} \tag{3}$$

where:

$$S_{11}^M = \frac{b_1^M}{a_1^M} \tag{4}$$

With the power meter connected to Port 1, $S'_{11} = \Gamma'_P$, and thus, the corrected value of the power meter input reflection coefficient $\Gamma'_P$ is represented by the following equation:

$$\Gamma_P = \frac{\Gamma_P^M - E_{d_1}}{E_{r_1} + E_{s_1}(\Gamma_P^M - E_{d_1})} = \frac{\Gamma_P^M - I_{11}}{I_{12}I_{21} + I_{22}(\Gamma_P^M - I_{11})} \tag{5}$$

where the measured power meter input reflection coefficient $\Gamma_P^M$ is determined from the input and reflection travelling-waves $a_1^M$ and $b_1^M$ measured at the network analyzer when the power meter is connected to the network analyzer as follows:

$$\Gamma_P^M = \frac{b_1^M}{a_1^M} \tag{6}$$

Therefore, the absolute magnitude of the travelling-wave $a_{1P}$ at the power meter can be represented by the following equation:

$$|a_{1P}| = \frac{|a_1^M||I_{21}|}{|1 - I_{22}\Gamma_P|} \tag{7}$$

In addition, the power meter reading can be represented by the following equation:

$$P_{reading} = |a_{1P}|^2(1 - |\Gamma'_P|^2) \tag{8}$$

Combining equations 7 and 8, the magnitude of the unresolved error coefficient $I_{21}$ can be solved for by observing:

$$\frac{|a_{1P}^M||I_{21}|}{|1 - I_{22}\Gamma_P|} = |a_{1P}| = \sqrt{\frac{P_{reading}}{1 - |\Gamma_P|^2}} \tag{9}$$

As a result, $$|I_{21}| = \sqrt{\frac{P_{reading}}{1 - |\Gamma_P|^2}} \frac{|1 - I_{22}\Gamma_P|}{|a_{1P}^M|} \tag{10}$$

It should be understood that in other embodiments, error coefficient $I_{12}$ could also be solved for in a similar manner. Once the value of the error coefficient $I_{21}$ is known, the absolute magnitude of the travelling-wave $a_1$ at the DUT can be solved for using the following equation:

$$|a_1| = \frac{|a_1^M||I_{21}|}{|1 - I_{22}S'_{11}|} = \frac{|a_1^M|\sqrt{\left[\frac{P_{reading}}{1 - |\Gamma_P|^2}\right]} \frac{|1 - I_{22}\Gamma_P|}{|a_{1P}^M|}}{|1 - I_{22}S'_{11}|} \tag{11}$$

where $a_1^M$ is the measured value of the travelling-wave with a DUT in place during measurement of the actual, corrected S-parameters of the DUT.

Returning to the flow diagram of FIG. 2, once the absolute magnitude of the travelling-wave $a_1$ at the DUT is determined, the absolute magnitude of the travelling-wave $b_1$ at the DUT can be calculated by observing:

$$b_1^M = I_{12}b_1 + I_{11}a_1^M \tag{12}$$

Thus, $$|b_1| = \frac{|b_1^M - I_{11}a_1^M|}{|I_{12}|} \tag{13}$$

where again $b_1^M$ is the measured value of the travelling-wave with a DUT in place during measurement of the actual, corrected S-parameters of the DUT and the value of the error coefficient $I_{12}$ is obtained from the calculated error term $E_{r1}$ and the calculated error coefficient $I_{21}$ as follows:

$$|I_{12}| = \frac{|E_{r1}|}{|I_{21}|} \quad (14)$$

Figure 3:
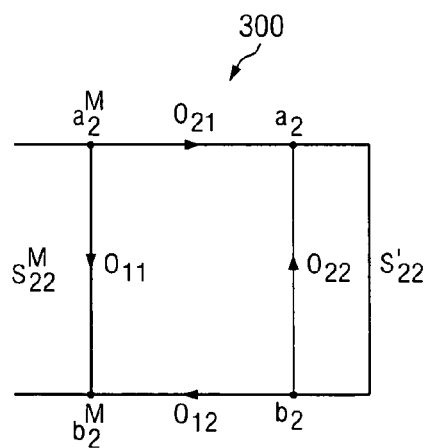
FIG. 3 is a flow diagram of the one-port reverse error model for measuring the input reflection coefficient at port 2.

The reverse error model, shown in FIG. 3, yields similar results for the measuring the input reflection coefficient $S'_{22}$ at Port 2. The reverse error model 300 is composed of error coefficients $O_{11}$, $O_{12}$, $O_{21}$ and $O_{22}$. The familiar error terms $E_{d2}$, $E_{r2}$ and $E_{s2}$ calculated during the normal, full, two-port calibration of the network analyzer are related to the error coefficients $O_{11}$, $O_{12}$, $O_{21}$ and $O_{22}$ as follows: $E_{d2}=O_{11}$; $E_{s2}=O_{22}$; and $E_{r2}=O_{12}O_{21}$. $E_{r2}$ corresponds to the reverse reflection error term, $E_{d2}$ corresponds to the reverse directivity error term and $E_{s2}$ corresponds to the reverse source match error term.

It can be observed from FIG. 3 that the value of node $a_2$ can be represented by the following equation:

$$a_2 = \frac{a_2^M O_{21}}{1 - O_{22}S'_{22}} \quad (15)$$

and so:

$$|a_2| = \frac{|a_2^M||O_{21}|}{|1 - O_{22}S'_{22}|} \quad (16)$$

The one-port input reflection coefficient $S'_{22}$ is represented by:

$$S'_{22} = \frac{S_{22}^M - E_{d_2}}{E_{r_2} + E_{s_2}(S_{22}^M - E_{d_2})} = \frac{S_{22}^M - O_{11}}{O_{12}O_{21} + O_{22}(S_{22}^M - O_{11})} \quad (17)$$

where:

$$S_{22}^M = \frac{b_2^M}{a_2^M} \quad (18)$$

With a zero-loss, zero-length thru in place of the DUT, $a_2=b_1$ because the reflection coefficients of a thru standard are equal to zero ($S_{11}=S_{22}=0$) and the transmission coefficients of a thru are equal to one ($S_{12}=S_{21}=1$). Therefore, combining equations 13 and 16 provides the following equation to solve for the magnitude of the error coefficient $O_{21}$:

$$|O_{21}| = \frac{|b_{1_{THRU}}^M - I_{11}a_{1_{THRU}}^M||1 - O_{22}S'_{22}|}{|I_{12}||a_{2_{THRU}}^M|} \quad (19)$$

where the measured values of $a_1$, $a_2$ and $b_1$, are measured with a zero-loss, zero-length thru standard in place of the DUT and stimulus applied at Port 2. With the value of 021, the absolute magnitude of the travelling-wave $a_2$ at the DUT can be calculated using equation 16 above, and the absolute magnitude of the travelling-wave $b_2$ at the DUT can be calculated using an expression similar to equation 13 above.

The above discussion provides a solution for determining the absolute magnitude of the travelling-waves at the DUT reference plane. However, if the DUT is at a non-coaxial plane, such as on a wafer, where a power meter cannot be connected, in accordance with embodiments of the present invention, further calibrations are performed to allow the power calibration measurements made at the coaxial plane, as described above, to be transferred to the desired non-coaxial DUT reference plane. As used herein, the term non-coaxial refers to any type of connection that is incompatible with a power meter.

Figure 4:
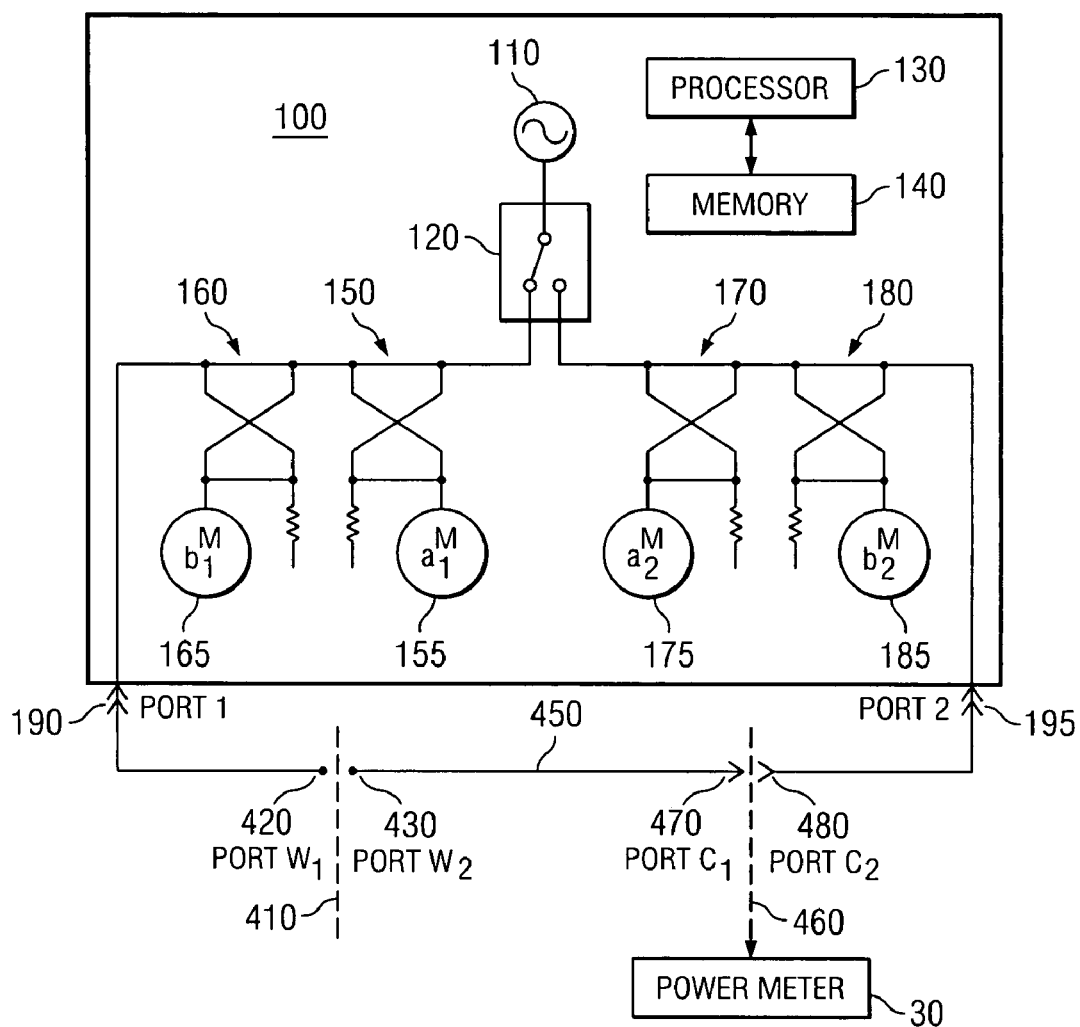
FIG. 4 is a block diagram of an exemplary S-parameter measurement device having a coaxial interface and a non-coaxial interface that is incompatible with a power meter, in accordance with embodiments of the present invention.

FIG. 4 is a block diagram of an exemplary S-parameter power wave calibration system 400 for determining the absolute magnitudes of travelling-waves at a non-coaxial reference plane of a device under test (DUT), in accordance with embodiments of the present invention. Power wave calibration system 400 includes the network analyzer 100 and power meter 30 of FIG. 1. Thus, the discussion of network analyzer 100 and power meter 30 with reference to FIG. 1 above is also applicable to FIG. 4. In addition, as in FIG. 1, processor 130 and memory medium 140, shown in network analyzer 100, together control the operation of the network analyzer 100 and the power wave calibration system 400. It should be understood that in other embodiments, at least a portion of memory medium 140 and/or processor 130 can be located external to network analyzer 100.

In FIG. 4, power meter 30 is connected to network analyzer 100 at a coaxial plane 460 resident between two coaxial ports C 1 470 and C2 480. A DUT (not shown) can be inserted at a non-coaxial plane 410 resident between two non-coaxial ports W1 420 and W2 430. For example, non-coaxial ports W1 420 and W2 430 can be planar waveguide interfaces for a wafer. Port W1 420 is connected to Port 1 190 of network analyzer 100 and Port C2 480 is connected to Port 2 195 of network analyzer 100. Port C1 470 is connected to Port W2 430 via an adapter link 450.

Power wave calibration system 400 is designed to perform a power wave calibration of network analyzer 100 to determine the absolute magnitude of each of the travelling-waves $a_1$, $b_1$, $a_2$ and $b_2$ at the non-coaxial DUT insertion plane 410. In accordance with embodiments of the present invention, initially, power wave calibration system 400 carries out a calibration of network analyzer 100 at the coaxial Ports C1 470 and C2 480 of the coaxial plane 460 to calculate the error terms for the error model of network analyzer 100 at the coaxial plane 460. The coaxial calibration is performed with a thru connection at the non-coaxial plane 410. In one embodiment, the coaxial calibration is a full, two-port calibration. However, in other embodiments, the coaxial calibration may be a modified calibration to calculate specific error terms for the error model of the network analyzer 100.

Once the error terms for the two-port error model have been computed, power meter 30 is attached to one of the coaxial ports (e.g., coaxial Port C2 480) at the coaxial plane 460 to obtain power wave measurements at the coaxial plane 460. At a single, convenient power level, the raw signal values $a_1^M$ and $b_1^M$ are measured to determine the input reflection coefficient $I'_P$ of the power meter $I'_P$ while connected to Port C2 480 using the one-port error terms (shown in FIG. 3), which are easily derived from the two-port error model.

After the power meter measurement, power wave calibration system 400 carries out a calibration of network analyzer 100 at the non-coaxial Ports W1 420 and W2 430 of the non-coaxial plane 410 to calculate the error terms for the error model of network analyzer 100 at the non-coaxial plane 410. The non-coaxial calibration is performed with a thru connection at the coaxial plane 460. In one embodiment, the non-coaxial calibration is a full, two-port calibration. However, in other embodiments, the non-coaxial calibration may be a modified calibration to calculate specific error terms for the error model of the network analyzer 100.

From the coaxial calibration and the non-coaxial calibration, a two-port calibration is extracted for the adapter link 450 using an adapter removal algorithm to determine the S-parameters of the adapter link 450. The adapter removal algorithm takes as input the calculated error terms for the coaxial plane 460 and the calculated error terms for the non-coaxial plane 410 and outputs the error terms for the adapter link 450. An example of an adapter removal algorithm is described in Ferrero et al., "Two-Port Network Analyzer Calibration Using an Unknown 'Thru'," IEEE Microwave and Guided Wave Letters, Vol. 2, No. 12, pp. 505–507 (December 1992). In one embodiment, the S-parameters of the adapter link 450 can be derived using the original measured values of the travelling-waves at the coaxial plane 460 and non-coaxial plane 410. In another embodiment, the S-parameters of the adapter link 450 can be measured using the error terms for the adapter link 450 yielded by the adapter removal algorithm.

The absolute magnitude of the input travelling-wave (e.g., $a_{2W}$) at the non-coaxial DUT insertion plane 410 can be calculated using the coaxial error terms, non-coaxial error terms, power wave measurements and S-parameters of the adapter link, as will be described in more detail below.

Figure 5:
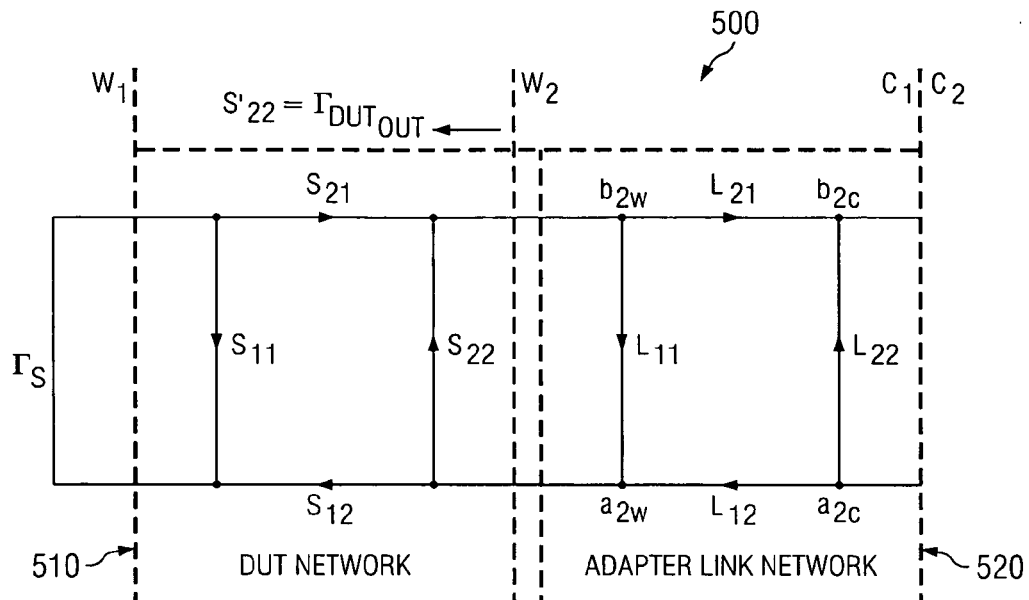
FIG. 5 is a signal flow diagram at the interface between the coaxial plane and the non-coaxial plane with a thru at the coaxial plane and a device under test (DUT) at the non-coaxial plane, in accordance with embodiments of the present invention.

FIG. 5 depicts the signal flow diagram 500 around the adapter link at the interface between the coaxial plane and the non-coaxial plane with a thru at the coaxial plane between ports C1 and C2 and a device under test (DUT) at the non-coaxial plane inserted between ports W1 and W2, in accordance with embodiments of the present invention. The signal flow diagram 500 is composed of a DUT network 510 and an adapter link network 520. DUT network 510 is composed of the actual, corrected S-parameters of the DUT $S_{11}$, $S_{12}$, $S_{21}$ and $S_{22}$ determined when measured between non-coaxial ports W1 and W2 using the non-coaxial error terms previously calculated during the non-coaxial calibration.

Adapter link network 520 is composed of the actual, corrected S-parameters of the adapter link $L_{11}$, $L_{12}$, $L_{21}$ and $L_{22}$ determined using the adapter error terms previously calculated using the adapter removal algorithm. $L_{11}$ is coupled between nodes $b_{2W}$ and $a_{2W}$, $L_{12}$ is coupled between nodes $a_{2W}$ and $a_{2C}$, $L_{21}$ is coupled between nodes $b_{2W}$ and $b_{2C}$ and $L_{22}$ is coupled between nodes $b_{2C}$ and $a_{2C}$. Node $a_{2C}$ represents input travelling-wave as seen at the input of the adapter link network 520 from the Port 2 side of the coaxial plane. Node $a_{2W}$ represents the input travelling-wave as seen at the input of the non-coaxial plane at port W2 from the adapter link network 520. Node $b_{2C}$ represents the reflected travelling-wave as seen at the output of the adapter link network 520 towards the Port 2 side of the coaxial plane. Node $b_{2W}$ represents the reflected travelling-wave as seen at the output of the non-coaxial plane at port W2 from the DUT network 510.

Following from the coaxial calibration and the power meter measurement performed at the coaxial plane, it is possible to rewrite Equation 2 described above in connection with FIG. 2 to determine $a_{2C}$, the travelling-wave propagating across a zero-length thru at the C1 port towards the adapter link network 520:

$$|a_{2C}| = \frac{|a_2^M||C_{21}|}{|1 - C_{22}L'_{22}|} \tag{20}$$

With a power meter connected at port C2 to obtain a value of $C_{21}$, Equation 20 becomes:

$$|a_{2C}| = \frac{|a_2^M||C_{21}|}{|1 - C_{22}L'_{22}|} = \frac{|a_2^M|\sqrt{\left[\frac{P_{reading}}{1-|\Gamma_P|^2}\right]}\frac{|1-C_{22}\Gamma_P|}{|a_{2P}^M|}}{|1 - C_{22}L'_{22}|} \tag{21}$$

where the familiar error terms are $E_{d2}=C_{11}$; $E_{s2}=C_{22}$; and $E_{r2}=C_{12}C_{21}$, and where the reflection coefficient looking into the adapter link network 520 from the coaxial side, $L'_{22}$ is given by:

$$L'_{22} = \frac{S_{22}^M - C_{d_2}}{C_{r_2} + C_{s_2}(S_{22}^M - C_{d_2})} \tag{22}$$

and $$S_{22}^M = \frac{b_2^M}{a_2^M} \tag{23}$$

Thus, $L'_{22}$ is what is returned when measuring the reflection coefficient looking towards the adapter link network 520 from the Port 2 side of the coaxial calibration plane with a zero-length thru between ports C1 and C2 using the one-port error terms derived from the full two-port error model.

It can be observed from FIG. 5 that the magnitude of the travelling-wave incident on the W2 port from the Port 2 side of the coaxial plane ($a_{2W}$) is:

$$a_{2W} = a_{2C}L_{12} + b_{2W}L_{11} \tag{24}$$

In addition, it can be readily seen that the one-port input reflection coefficient seen looking into the port W2 side of the DUT ($S'_{22}$) is:

$$S'_{22} = \frac{b_{2W}}{a_{2W}} \tag{25}$$

Combining Equation 24 with Equation 25 yields:

$$a_{2W} = \frac{a_{2C}L_{12}}{1 - S'_{22}L_{11}} \tag{26}$$

where all of the terms are known, except $S'_{22}$, the reflection coefficient seen looking into the Port 2 side of the DUT network 510.

In one embodiment, $S'_{22}$ is determined by observing that $S'_{22}$ is what would be measured using the one-port error terms ($W_{r2}$, $W_{s2}$ and $W_{d2}$) extracted from the two-port non-coaxial error terms. Thus, $S'_{22}$ is given by:

$$S'_{22_W} = \frac{b_{2W}}{a_{2W}} = \frac{S^M_{22w} - W_{d_2}}{W_{r_2} + W_{s_2}(S^M_{22w} - W_{d_2})} \quad (27)$$

With Equation 21, the absolute value of the input travelling-wave at the DUT network 510 is:

$$|a_{2W}| = \frac{|a_2^M||C_{21}||L_{12}|}{|1 - C_{22}L'_{22}||1 - S'_{22w}L_{11}|} \quad (28)$$

where $a_2^M$ is the measured value of the travelling-wave with a DUT inserted in the non-coaxial plane during measurement of the actual, corrected S-parameters of the DUT In another embodiment, the reflection coefficient seen looking into the Port 2 side of the DUT network 510 is given by the following formula that is well-known in the art:

$$S'_{22} = S_{22} + S_{21}\frac{\Gamma_S S_{12}}{1 - \Gamma_S S_{11}} \quad (29)$$

where $S_{11}$, $S_{12}$, $S_{21}$ and $S_{22}$ are the actual, corrected S-parameters of the DUT and $\Gamma_S$ is the reflection coefficient seen looking into the Port 1 side of the DUT network 510. Thus, all of the terms are known, except $\Gamma_S$. The error model relating $b_{1W}^M/a_{1W}^M$ to $b_{1W}/a_{1W}$ that is available from the non-coaxial calibration enables $\Gamma_S$ to be calculated. The error terms $W_{r2}$, $W_{s2}$ and $W_{d2}$ do not rely on the source. As a result, the one-port subset ($W_{r2}$, $W_{s2}$ and $W_{d2}$) of the two-port non-coaxial error terms can be used to obtain $\Gamma_S$ when a signal is applied at Port 2 as follows:

$$\Gamma_S = \frac{a_{1W}}{b_{1W}} = \frac{W_{r_1} + W_{s_1}(\Gamma_S^M - W_{d_1})}{\Gamma_S^M - W_{d_1}} = \frac{1}{S_{11}|_{a_1=0}} = S^{-1}_{11_{a2}} \quad (30)$$

where $S^{-1}_{11a2}$ is the measurement of the S-parameter $S_{11}$ at the DUT with a signal applied at Port 2, instead of Port 1. Combining Equations 29 and 30 yields a value for $S'_{22}$:

$$S'_{22} = S_{22} + S_{21}\frac{S^{-1}_{11_{a2}}S_{12}}{1 - S^{-1}_{11_{a2}}S_{11}} \quad (31)$$

Putting Equation 31 into Equation 26, and taking the absolute value gives:

$$|a_{2W}| = \frac{|a_{2C}||L_{12}|}{|1 - L_{11}\{S_{22} + S_{21}S^{-1}_{11_{a2}}S_{12}/(1 - S^{-1}_{11_{a2}}S_{11})\}|} \quad (32)$$

which when combined with Equation 21 that provides the value for $a_{2C}$ yields:

$$|a_{2W}| = \frac{|a_2^M||C_{21}||L_{12}|}{|1 - C_{22}L'_{22}||1 - L_{11}\{S_{22} + S_{21}S^{-1}_{11_{a2}}S_{12}/(1 - S^{-1}_{11_{a2}}S_{11})\}|} \quad (33)$$

Equation 33 has the same form as Equation 27, namely a cascade of two correction terms each including a transfer scalar divided by one minus the product of a source correction term and a downstream reflection coefficient, so Equation 33 can be more explanatively written as:

$$|a_{2W}| = |a_2^M|\frac{|C_{21}|}{|1 - C_{22}L'_{22}|}\frac{|L_{12}|}{|1 - L_{11}\Gamma_{DUT_{OUT}}|} \quad (33)$$

The error model for Port W1 resembles the error model for port 1 in the coaxial example described above in connection with FIG. 2. Thus, substituting error terms $V_{r2}$, $V_{s2}$ and $V_{d2}$ for the Port 1 side non-coaxial plane error model in Equation 4 produces:

$$|a_{1W}| = \frac{|a_1^M||V_{21}|}{|1 - V_{22}S'_{11}|} \quad (34)$$

where:

$$S'_{11} = \frac{S^M_{11_W} - W_{d_1}}{W_{r_1} + W_{s_1}(S^M_{11_W} - W_{d_1})} = \frac{S^M_{11} - V_{11}}{V_{12}V_{21} + V_{22}(S^M_{11} - V_{11})} \quad (35)$$

With all of the terms in Equation 34 known except $V_{21}$, to find $|a_{1W}|$, the reflection tracking error term $W_{r1}$ must be separated into its constituent error coefficients $V_{12}$ and $V_{21}$ to solve for $V_{21}$. With a zero-length thru at the DUT non-coaxial reference plane, $a_{2W}=b_{1W}$ because the reflection coefficients of a thru standard are equal to zero ($S_{11}=S_{22}=0$) and the transmission coefficients of a thru standard are equal to one ($S_{12}=S_{21}=1$). Thus, when measuring with stimulus at Port 2:

$$|b_{1W}| = \frac{|b_1^M - V_{11}a_1^M|}{|V_{12}|} = |a_{2W}| \quad (36)$$

Combining Equation 36 with Equation 33 produces:

$$\frac{|b_1^M - V_{11}a_1^M|}{|V_{12}|} = |a_{2W}| = \frac{|a_2^M||C_{21}||L_{12}|}{|1 - C_{22}L'_{22}||1 - L_{11}S'_{22_W}|} \quad (37)$$

from which we can determine $V_{12}$:

$$|V_{12}| = \frac{|b_1^M - V_{11}a_1^M||1 - C_{22}L'_{22}||1 - L_{11}S'_{22_W}|}{|a_2^M||C_{21}||L_{12}|} \quad (38)$$

Since $V_{21}=W_{r1}/V_{12}$, the value of $V_{21}$ can be determined as follows:

$$|V_{21}| = \frac{|W_{r_1}||a_2^M||C_{21}||L_{12}|}{|b_1^M - V_{11}a_1^M||1 - C_{22}L'_{22}||1 - L_{11}S'_{22_W}|} = \quad (39)$$

$$\frac{|V_{12}V_{21}||a_2^M||C_{21}||L_{12}|}{|b_1^M - V_{11}a_1^M||1 - C_{22}L'_{22}||1 - L_{11}S'_{22_W}|}$$

Equation 39 can be expanded by noting that both $L'_{22}$ and $S'_{22_W}$ are function of $a_2^M$, $b_2^M$ and known constants from the error models. Thus, Equation 27 yields:

$$S'_{22_W} = \frac{\frac{b_2^M}{a_2^M} - W_{d_2}}{W_{r_2} + W_{s_2}\left(\frac{b_2^M}{a_2^M} - W_{d_2}\right)} = \frac{\frac{b_2^M}{a_2^M} - U_{11}}{U_{12}U_{21} + U_{22}\left(\frac{b_2^M}{a_2^M} - U_{11}\right)} \quad (40)$$

and Equation 22 yields:

$$L'_{22} = \frac{\frac{b_2^M}{a_2^M} - C_{d_2}}{C_{r_2} + C_{s_2}\left(\frac{b_2^M}{a_2^M} - C_{d_2}\right)} = \frac{\frac{b_2^M}{a_2^M} - C_{11}}{C_{12}C_{21} + C_{22}\left(\frac{b_2^M}{a_2^M} - C_{11}\right)} \quad (41)$$

Figure 6:
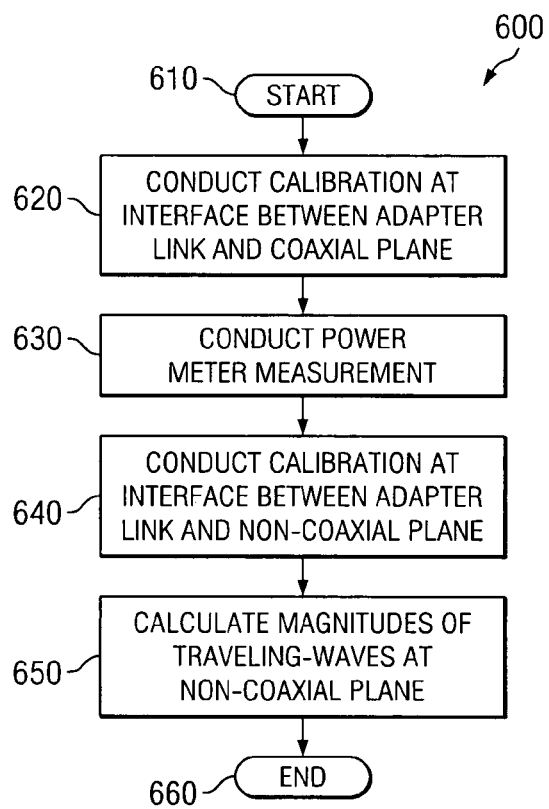
FIG. 6 is a flow chart illustrating an exemplary process for determining the magnitude of a travelling-wave at the non-coaxial plane, in accordance with embodiments of the present invention.

FIG. 6 is a flow chart illustrating an exemplary process 600 for determining the magnitude of a travelling-wave at a non-coaxial plane, in accordance with embodiments of the present invention. The process begins at step 610. At step 620, a calibration of the network analyzer is conducted at a coaxial plane to calculate the error terms for the error model of the network analyzer at the coaxial plane. The coaxial calibration is performed at an interface between the coaxial plane and an adapter link between the non-coaxial plane and the coaxial plane.

Once the error terms for the error model have been computed, at step 630, a power meter is attached to one of the coaxial ports at the coaxial plane to obtain power wave measurements at the coaxial plane. At a single, convenient power level, the raw signal values of the travelling-waves $a_1^M$ and $b_1^M$ are measured to determine the input reflection coefficient of the power meter using the one-port error terms calculated in step 620. After the power meter measurement, at step 640, calibration of the network analyzer is conducted at the non-coaxial DUT reference plane at the interface between the adapter link and the non-coaxial plane to calculate the error terms for the error model of the network analyzer at the non-coaxial plane. At step 650, the absolute magnitude of the input travelling-wave at the non-coaxial DUT reference plane is calculated using the coaxial error terms, non-coaxial error terms and power wave measurements, as described above. The process ends at step 660.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

I claim:

1. A method for determining magnitudes of travelling-waves at a non-coaxial plane of a scattering (S) parameter measurement device, the S-parameter measurement device including an adapter link between the non-coaxial plane and a coaxial plane, the method comprising:
   conducting a calibration at an interface between the adapter link and the coaxial plane to derive coaxial error terms for the S-parameter measurement device;
   conducting a power meter measurement at the coaxial plane to obtain power wave measurements using the coaxial error terms;
   conducting a calibration at an interface between the adapter link and the non-coaxial plane to derive non-coaxial error terms for the S-parameter measurement device; and
   calculating a magnitude of a select one of the travelling-waves at the non-coaxial plane using the coaxial error terms, the power wave measurements and the non-coaxial error terms.

2. The method of claim 1, wherein said conducting the calibration at the coaxial plane further comprises:
   conducting a full two-port calibration at the coaxial plane to determine a first set of error terms; and
   deriving the coaxial error terms for one coaxial port from the first set of error terms.

3. The method of claim 2, wherein said conducting the calibration at the non-coaxial plane further comprises:
   conducting a full two-port calibration at the non-coaxial plane to determine a second set of error terms; and
   deriving the non-coaxial error terms for one non-coaxial port from the second set of error terms.

4. The method of claim 1, wherein said conducting the power meter measurement further comprises:
   attaching a power meter to a coaxial port of the S-parameter measurement device at the coaxial plane.

5. The method of claim 4, wherein said conducting the power meter measurement further comprises:
   determining a corrected reflection coefficient of the power meter using the coaxial error terms; and
   determining a power meter reading.

6. The method of claim 1, further comprising:
   determining a magnitude of an additional one of the travelling waves at the non-coaxial plane.

7. The method of claim 1, wherein said calculating further comprises:
   extracting a calibration for the adapter link using an adapter removal algorithm to determine adapter error terms for the adapter link;
   determining the S-parameters of the adapter link using the adapter error terms; and
   calculating the magnitude of the select travelling-wave at the non-coaxial plane using the coaxial error terms, the power wave measurements, the non-coaxial error terms and the S-parameters of the adapter link.

8. The method of claim 7, wherein said calculating further comprises:
   determining a relationship between a measured value and a corrected value of the magnitude of an additional travelling-wave propagating across a zero-length thru at the coaxial plane towards the adapter link using the magnitude of a component of a composite one of the coaxial error terms.

9. The method of claim 8, wherein the coaxial error terms include a reflection tracking error term equated to the product of two error coefficients, and wherein said determining the magnitude of the additional travelling-wave further comprises:
   determining a value for the magnitude of one of the two error coefficients using the power wave measurements;

determining a value of a reflection coefficient one of the S-parameters of the adapter link; and determining the magnitude of the additional travelling-wave using the value of one of the two error coefficients of the coaxial error terms and the value of the reflection coefficient S-parameter of the adapter link.

10. The method of claim 8, wherein said calculating further comprises:

calculating the magnitude of the select travelling-wave using the magnitude of the additional travelling-wave, the S-parameters of the adapter link and a value of a reflection coefficient S-parameter at the non-coaxial plane calculated using the non-coaxial error terms.

11. In a scattering (S) parameter measurement system for use with an S-parameter measurement device including an adapter link between a non-coaxial plane and a coaxial plane, a memory medium comprising software programmed to determine magnitudes of travelling-waves at the non-coaxial plane by:

conducting a calibration at an interface between the adapter link and the coaxial plane to derive coaxial error terms for the S-parameter measurement device;

conducting a power meter measurement at the coaxial plane to obtain power wave measurements using the coaxial error terms;

conducting a calibration at an interface between the adapter link and the non-coaxial plane to derive non-coaxial error terms for the S-parameter measurement device; and calculating a magnitude of a select one of the travelling-waves at the non-coaxial plane using the coaxial error terms, the power wave measurements and the non-coaxial error terms.

12. The memory medium of claim 11, wherein said conducting the calibration at the coaxial plane further comprises:

conducting a full two-port calibration at the coaxial plane to determine a first set of error terms; and deriving the coaxial error terms for one coaxial port from the first set of error terms.

13. The memory medium of claim 12, wherein said conducting the calibration at the non-coaxial plane further comprises:

conducting a full two-port calibration at the non-coaxial plane to determine a second set of error terms; and deriving the non-coaxial error terms for one non-coaxial port from the second set of error terms.

14. The memory medium of claim 11, wherein said conducting the power meter measurement further comprises:

attaching a power meter to a coaxial port of the S-parameter measurement device at the coaxial plane.

15. The memory medium of claim 14, wherein said conducting the power meter measurement further comprises:

determining a corrected reflection coefficient of the power meter using the coaxial error terms; and determining a power meter reading.

16. The memory medium of claim 11, wherein the method further comprises:

determining a magnitude of an additional one of the travelling waves at the non-coaxial plane.

17. The memory medium of claim 11, wherein said calculating further comprises:

extracting a calibration for the adapter link using an adapter removal algorithm to determine adapter error terms for the adapter link;

determining the S-parameters of the adapter link using the adapter error terms; and calculating the magnitude of the select travelling-wave at the non-coaxial plane using the coaxial error terms, the power wave measurements, the non-coaxial error terms and the S-parameters of the adapter link.

18. The memory medium of claim 17, wherein said calculating further comprises:

determining a magnitude of an additional travelling-wave propagating across a zero-length thru at the coaxial plane towards the adapter link using the coaxial error terms and the S-parameters of the adapter link.

19. The memory medium of claim 18, wherein the coaxial error terms include a reflection tracking error term equated to the product of two error coefficients, and wherein said determining the magnitude of the additional travelling-wave further comprises:

determining a value of one of the two error coefficients using the power wave measurements;

determining a value of a reflection coefficient one of the S-parameters of the adapter link; and determining the magnitude of the additional travelling-wave using the value of one of the two error coefficients of the coaxial error terms and the value of the reflection coefficient S-parameter of the adapter link.

20. The memory medium of claim 18, wherein said calculating further comprises:

calculating the magnitude of the select travelling-wave using the magnitude of the additional travelling-wave, the S-parameters of the adapter link and a value of a reflection coefficient S-parameter at the non-coaxial plane calculated using the non-coaxial error terms.

21. The memory medium of claim 11, wherein the S-parameter measurement device includes a vector network analyzer.

22. The memory medium of 11, wherein the memory medium is within the S-parameter measurement device.

23. The memory medium of claim 11, wherein the S-parameter measurement device is controlled by an external computer system.

24. The memory medium of claim 23, wherein the memory medium is within the computer system.

25. The memory medium of claim 23, wherein the memory medium is a transportable computer-readable medium.

26. The memory medium of claim 11, wherein the memory medium is flash ROM, EEPROM or EPROM.

* * * * *

UNITED STATES PATENT AND TRADEMARK OFFICE
CERTIFICATE OF CORRECTION

PATENT NO. : 6,982,561 B2  Page 1 of 1
APPLICATION NO. : 10/857419
DATED : January 3, 2006
INVENTOR(S) : Scott It is certified that error appears in the above-identified patent and that said Letters Patent is hereby corrected as shown below:

On Title Page, in field (56), under "Other Publications", in column 2, line 5, delete "system:" and insert -- system; --, therefor.

In column 16, line 45, in Claim 22, after "of" insert -- claim --.

Signed and Sealed this

First Day of August, 2006

JON W. DUDAS
*Director of the United States Patent and Trademark Office*